US006894616B1

(12) United States Patent
Forster

(10) Patent No.: US 6,894,616 B1
(45) Date of Patent: May 17, 2005

(54) PIEZO-ELECTRIC TAG

(75) Inventor: Ian J Forster, Chelmsford (GB)

(73) Assignee: Mineral Lassen LLC, Las Vegas, NV (US)

( * ) Notice: Subject to any disclaimer, the term of this patent is extended or adjusted under 35 U.S.C. 154(b) by 250 days.

(21) Appl. No.: 10/048,108

(22) PCT Filed: Jul. 31, 2000

(86) PCT No.: PCT/GB00/02944
§ 371 (c)(1),
(2), (4) Date: May 30, 2002

(87) PCT Pub. No.: WO01/09640
PCT Pub. Date: Feb. 8, 2001

(30) Foreign Application Priority Data

Jul. 29, 1999 (GB) .............................. 9917856

(51) Int. Cl.$^7$ ............................................. G08B 13/14
(52) U.S. Cl. ...................... 340/572.1; 330/171; 310/310
(58) Field of Search ........................... 340/572.1, 10.34;
330/79, 165, 166, 167, 168, 169, 170, 171, 188, 190, 195; 342/30; 235/491, 492; 310/310, 311, 313 R

(56) References Cited

U.S. PATENT DOCUMENTS

| 1,863,345 | A | * | 6/1932 | Nicolson ..................... 330/174 |
| 4,870,700 | A | | 9/1989 | Ormanns et al. |
| 4,951,057 | A | | 8/1990 | Nagel |
| 5,132,665 | A | * | 7/1992 | Hutchisson et al. ........ 340/463 |
| 5,389,852 | A | | 2/1995 | Toda |
| 5,408,168 | A | * | 4/1995 | Pfandler ..................... 318/642 |
| 5,457,447 | A | | 10/1995 | Ghaem et al. |
| 5,749,909 | A | | 5/1998 | Schroeppel et al. |
| 5,828,160 | A | | 10/1998 | Sugishita |
| 5,886,514 | A | * | 3/1999 | Iguchi et al. ................ 323/299 |
| 5,942,858 | A | * | 8/1999 | Sokolov ...................... 315/246 |
| 5,969,462 | A | * | 10/1999 | Huang et al. ................ 310/318 |
| 6,111,765 | A | * | 8/2000 | Ganser et al. ................. 363/55 |

FOREIGN PATENT DOCUMENTS

| DE | 196 08 515 C1 | 6/1997 |
| DE | 197 55 893 A1 | 6/1999 |
| EP | 0 827 105 A2 | 7/1997 |
| GB | 2 303 767 A | 2/1997 |
| GB | 2 306 081 A | 4/1997 |
| WO | WO 99/35276 | 8/1998 |

* cited by examiner

Primary Examiner—John Tweel, Jr.
Assistant Examiner—D Savoy
(74) Attorney, Agent, or Firm—Christensen O'Connor Johnson Kindness PLLC

(57) ABSTRACT

A piezo-electric tag in the form of a card has a first dipole antenna, a first rectification circuit, a piezo-electric transformer, a second rectification circuit, and a transponder circuit. In operation, the antenna receives incoming radiation and generates a corresponding signal which propagates to the first circuit which demodulates and filters it to generate a signal which is applied to the transformer to excite it. The transformer increases the voltage amplitude of the signal by generating a relatively higher voltage amplitude signal which is used in the tag to generate a signal for supplying power to the transponder. The transformer provides voltage magnitude enhancement to generate potentials suitable for operating active electronic circuits incorporated into the tag. The tag can be personnel wearable and even adapted for permanent inclusion into biological systems.

25 Claims, 6 Drawing Sheets

US 6,894,616 B1

PIEZO-ELECTRIC TAG

This application is a 371 national stage entry of PCT/GB00/02944 dated Jul. 31, 2000, which claims priority to United Kingdom application 9917856.8 dated Jul. 29, 1999.

The present invention relates to a piezo-electric tag.

BACKGROUND OF THE INVENTION

Tags are portable devices which are capable of being attached to items or personnel wearable. They can be used, for example, for remotely identifying the items or receiving information therefrom. In many applications, the tags must be compact and be capable of responding after long periods of inactivity, for example where the tags are incorporated into items placed into storage for periods of several years.

Conventionally, tags can be passive devices which modify and reflect interrogating radiation directed thereto from associated interrogating sources. Because the tags do not provide power gain, their operating range from the sources is often limited to a few meters.

Active tags are known which incorporate onboard power sources such as a miniature electrical cell. Such power sources have a limited operating lifetime, especially if they are required to power their associated tags continuously. Moreover, the sources can make the tags unacceptably bulky for some applications, for example where tags are implemented as film strips for incorporating into spines of library books.

Although it is feasible to power tags from radiation incident thereupon, for example using solar cells incorporated into the tags or by inductively coupling energy from associated interrogating sources to the tags, it is not practicable in some circumstances to do this for safety reasons, for reasons of restricted operating range or for reasons of obscuration in the case of solar cells.

The use of received radio radiation for powering electronic tags is known in the art, for example as disclosed in a published patent application no GB 2 306 081A. In the application, there is described a passive electrical power supply for providing electrical power to an electronic tag, the supply comprising an antenna for converting received radio frequency radiation into a first electrical signal, and a transformer including wire-wound coils for transforming the first signal into a second signal capable of altering the impedance of a field effect transistor (FET). In operation, the FET provides at its drain electrode a quasi half-wave rectified representation of the second signal which is converted to a unipolar signal by a capacitor connected to the drain electrode, the unipolar signal providing a power supply potential for operating the tag. The supply is operable to convert the received radiation into the unipolar signal such that the transformer operates at the frequency of the received radiation received at the antenna. The transformer can optionally be an autotransformer comprising a single wire-wound coil.

A power supply for a transponder is also disclosed in a published patent application no. GB 2 303 767 A. The supply described provides power to a response circuit of the transponder, the supply generating direct current (d.c.) from received electromagnetic energy. The supply comprises a capacitor charged from a rectifier diode, the diode having a characteristic such that its reverse resistance against a reverse current directed at its n region to its p region is lower than its forward resistance against a reverse current directed from its p region to its n region. The diode is thus connected reversely compared to a conventional diode, its anode being connected to a positive plate of the capacitor. The arrangement allows the transponder to remain functional even when the received electromagnetic energy is relatively weak. The required characteristic for the diode can be implemented by the avalanche or tunnel effect. Moreover, a voltage multiplier may be provided by using a plurality of the diodes with associated capacitors for generating higher supply potentials. The supply does not employ any form of transformer for increasing the potential of signals generated in response to receiving the electromagnetic energy.

Piezo-electric transformers capable of stepping up potentials are also known in the art, for example as described in U.S. patent nos. U.S. Pat. No. 5,828,160 and U.S. Pat. No. 5,389,852. Such transformers are operable to resonate at a frequency typically in a range of several tens of kHz to 300 kHz when stepping up potentials. This range of frequencies is considerably less than that used for electromagnetic radiation conventionally employed to interrogate electronic tags, for example 10 MHz to 30 GHz. Although piezoelectric transformers operating at frequencies above 300 kHz can be fabricated for example 600 z, their cost and difficulty of fabrication renders them unattractive for items such as electronic tags.

Non-contact energy coupling schemes employing piezo-electric devices are known in other technical fields, for example as disclosed in a U.S. Pat. No. 5,749,909 concerning medically implanted devices. In the patent, there is described an energy transmission system for transmitting energy non-invasively from an external unit to an implanted medical device to recharge a battery in the medical device. An alternating magnetic field is generated by the external unit and a piezo-electric device in the implanted medical device vibrates in response to the magnetic flux to generate a voltage. The voltage is rectified and regulated to provide charging current to a rechargeable battery in the medical device. In the arrangement, the piezoelectric device is stimulated by the magnetic flux at a resonant frequency of the device, namely in the order of tens of kHz.

The inventor has appreciated that a principal problem associated with tags operated from radiation incident thereupon is that it is difficult to generate potentials on the tags of sufficient magnitude to operate semiconductor integrated circuits incorporated therein. Such circuits frequently require a supply potential of several volts to function.

SUMMARY OF THE INVENTION

The inventor has devised a tag which addresses this principal problem and which is operable, for example, from moderate levels of incident radiation thereupon in the order of $10\,\mu$W. Such moderate levels of radiation rarely represent any health and safety risk.

According to a first aspect of the present invention, there is provided a piezoelectric tag including receiving means for receiving input radiation and generating a corresponding received signal, piezo-electric vibrating means for increasing voltage magnitude of the received signal to generate a supply potential and electronic circuit means powerable by the supply potential.

The invention provides the advantage that the vibrating means is capable of providing voltage magnification, thereby enabling the tag to be powered from radiation incident thereupon.

For the purpose of describing the invention, microwave frequencies means frequencies substantially in a range of 1 GHz to 30 GHz.

Advantageously, the vibrating means comprises a piezo-electric transformer incorporating mutually vibrationally coupled primary and secondary regions, the transformer operable to be excited into vibration by the received signal at the primary region and to generate a corresponding output signal at the secondary region for use in generating the supply potential.

The piezo-electric transformer provides the advantage that it is capable of being compact, inexpensive and providing a considerable increase in signal voltage amplitude from its primary region to its secondary region, the increase approaching 100 times or more.

Alternatively, the vibrating means comprises a piezoelectric bi-morph operable to be excited into vibration by the received signal and to generate a corresponding output signal for use in generating the supply potential.

As a further alternative, the vibrating means conveniently comprises a silicon micromachined device comprising an array of one or more resonant elements, each element incorporating an associated piezo-electric transducer operable to generate an element signal in response to vibration of its associated element, the transducers connected in series to add their element signals to provide an overall output from which the supply potential is generated, and driving means operable to be driven by the received signal for stimulating the one or more elements into vibration and thereby generating the supply potential.

The silicon device provides the advantage that it capable of being mass-produced and being highly compact, for example 2 mm wide by 2 mm long by 0.6 mm thick.

Advantageously, the resonant elements in the silicon device are operable at resonance to generate the supply potential. Operation at resonance provides the benefit that voltage magnification in the device is greater than off-resonance.

Moreover, to obtain even greater voltage magnification, the resonant elements are housed in an evacuated environment. Operation in the evacuated environment increases Q-factor of the resonant elements, thereby increasing voltage magnification provided by the silicon device.

Conveniently, the receiving means in the tag incorporates demodulating means for demodulating modulation components present in the received radiation to generate the received signal. Inclusion of the demodulating means provides the benefit of signal frequency transformation, thereby enabling the tag to receive radiation providing power thereto at a different carrier frequency to the frequency of vibration required for exciting the vibrating means.

Advantageously, the demodulating means incorporates zero-bias Schottky diodes for demodulating the received radiation to generate the received signal. The zero-bias Schottky diodes provide the advantage of exhibiting a smaller forward conduction voltage drop compared to p-n silicon junction diodes, thereby enabling the tag to function with lower levels of received radiation power, for example 10 $\mu$W.

Conveniently, the receiving means incorporates one or more conductive metallic film dipole antennae for one or more of receiving and emitting radiation. Such dipoles provide the advantage of being potentially compact and inexpensive to mass-produce.

The tag beneficially incorporates two antennae, one antenna for use in generating the received signal and the other incorporated into the responding means for at least one of emitting and receiving radiation. Incorporating two antennae provides the advantage that each antennae can be optimized to function at its respective radiation frequency.

Conveniently, the antennae are conductive metallic film dipole antennae for reasons of increased compactness and reduced manufacturing cost. Alternatively, the antennae can also be patch antennae or loop antennae.

In some practical applications of the tag, it is advantageous that the tag is implemented in the form of a block, for example a cuboid block. This form provides the tag with enhanced mechanical robustness and thereby increases its reliability.

When the tag is personnel wearable or attachable to items of merchandise, it is convenient that the tag is in the form of a planar card. This form provides the advantage that the tag can be of similar size to existing planar cards, for example debit cards, thereby providing a degree of potential compatibility with existing card reading equipment.

When the tag is implemented in a planar card form, it conveniently incorporate recesses for accommodating the receiving means, the vibrating means and the responding means. Such recesses provide protection for the receiving means and the responding means, thereby making the tag more robust.

In the tag, the circuit means can comprise responding means for emitting output radiation from the tag, the responding means powerable by the supply potential. Incorporation of the responding means enables the tag to be remotely identified when interrogated.

Conveniently, the responding means is a transponder operable to receive input radiation to the tag and emit output radiation in response from the tag. Incorporation of the transponder enables the tag to be selectively responsive to interrogating radiation in an environment which is flood illuminated with radiation for exciting the vibrating means.

Advantageously, the transponder is operable to modulate the output radiation with a signature code by which the tag can be individually identified. The code enables the tag to be individually recognised which is highly advantageous where the tag is personnel wearable and used to identify its wearer, for example as in personal identification tags worn by employees in a commercial establishment.

When operating with high frequency radiation, for example at UHF frequencies from 300 MHz to 1 GHz and from microwave frequencies from 1 GHz to 30 GHz, the tag advantageously has the transponder incorporating a reflection amplifier for amplifying the input radiation to generate the output radiation. The reflection amplifier provides the advantage that it is capable of providing a high gain, for example in a range of +10 dB to +30 dB, for relatively low current consumption, for example in the order of a few microamperes.

Advantageously, especially when the transponder provides considerable gain, the transponder is operable in a pseudo-continuous mode and incorporates a delay line for delaying the output radiation relative to the input radiation, thereby counteracting spontaneous oscillation from arising within the transponder from feedback therein.

Conveniently, the tag is arranged such that the receiving means incorporates first and second antennae for generating the received signal for exciting the vibrating means, the first antenna adapted to respond to microwave radiation and the second antenna adapted to respond to radiation having a carrier frequency corresponding to a resonant frequency of the vibrating means. Incorporation of two antennae for generating the received signal provides the advantage that the tag is powerable from radiation having a number of possible carrier frequencies.

In a second aspect of the invention, there is provided a method of guiding a vehicle along a path to a destination, the method comprising the steps of:
(a) distributing a plurality of tags according to the first aspect along the path and providing the vehicle with a direction sensitive interrogating source adapted to transpond with the tags;
(b) interrogating the tags from the source by emitting radiation to the tags and receiving radiation therefrom, thereby determining direction of the tags relative to the source and hence determining the path;
(c) moving the vehicle along the path; and
(d) repeating steps (b) and (c) until the vehicle reaches the destination.

BRIEF DESCRIPTION OF THE DRAWINGS

Embodiments of the invention will now be described, by way of example only, with reference to the following diagrams in which.

DETAILED DESCRIPTION OF THE PREFERRED EMBODIMENTS

Figure 1:
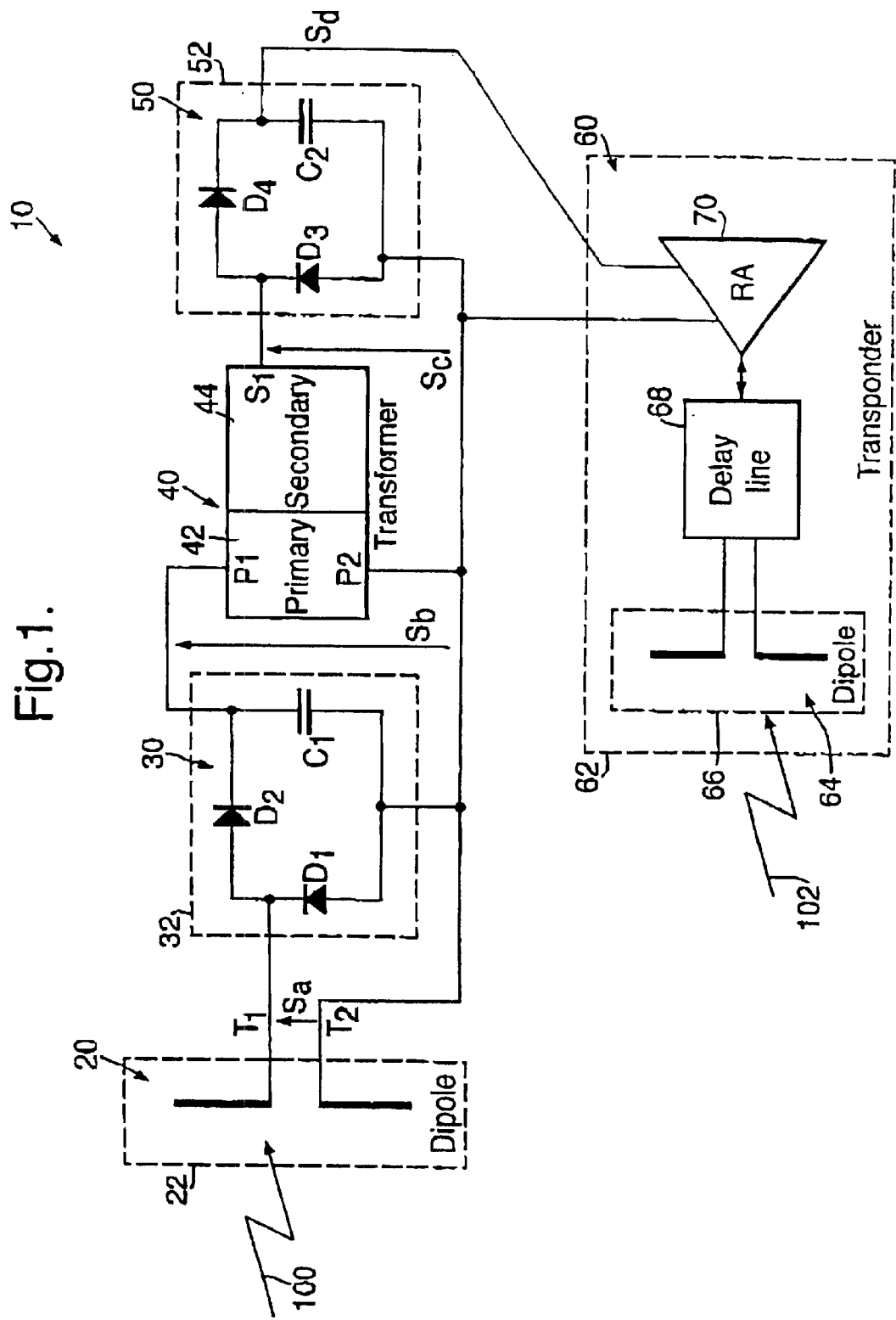
FIG. 1 is a schematic of a first embodiment of the invention.

Referring to FIG. 1, there is shown a piezo-electric tag according to a first embodiment of the invention indicated by 10. The tag 10 incorporates a number of sections, namely a first dipole antenna indicated by 20 and included within a dotted line 22, a first rectification circuit indicated by 30 and included within a dotted line 32, a piezoelectric transformer indicated by 40 incorporating a primary region 42 and a secondary region 44, a second rectification circuit indicated by 50 and included within a dotted line 52, and a transponder circuit indicated by 60 and included within a dotted line 62. The sections are incorporated into a plastic card having external dimensions of 55 mm width, 85 mm length and 1 mm thickness; this will be further described later with reference to FIG. 2.

The transponder 60 incorporates a dipole antenna indicated by 64 and included within a dotted line 66, a bi-directional surface acoustic wave (SAW) delay line 68 and a reflection amplifier 70.

The first dipole antenna 20 is connected to an input of the first rectification circuit 30. The circuit 30 includes an output which is connected to the primary region 42 of the transformer 40. The secondary region 44 thereof is connected to an input of the second rectification circuit 50. The second circuit 50 incorporates an output which is connected to a power supply input to the transponder 60.

Operation of the tag 10 will now be described in broad overview after which its sections will be described in further detail.

The antenna 20 receives incoming radiation 100 from an interrogating source (not shown). The radiation 100 has a carrier frequency of 1 GHz which is amplitude modulated to a modulation depth in a range of 50% to 100% by a modulating signal which has a frequency of 300 kHz. Moreover, the radiation 100 has a power density of 5 mW/m$^2$ at the antenna 20. The radiation 100 couples to the antenna 20 and generates a corresponding signal $S_a$ across output terminals $T_1$, $T_2$ of the antenna 20; the signal $S_a$ has a frequency of 1 GHz and an amplitude in the order of 80 mV. The signal $S_a$ propagates to the first circuit 30 which demodulates it and then filters it to substantially remove signal components above 1 MHz to generate a unipolar modulated signal $S_b$ having signal components at 300 kHz. The transformer 40 receives the signal $S_b$ across its primary region terminals $P_1$, $P_2$. The signal $S_b$ stimulates the primary and secondary regions 42, 44 to resonate at 300 kHz in their longitudinal mode of vibration. At resonance, the transformer 40 magnifies the signal $S_b$ received at its primary region 42 to generate a bipolar alternating signal $S_c$ at a secondary region terminal $S_1$, the signal $S_c$ having an amplitude in the order of 3 volts. The second circuit 50 receives the signal $S_c$ and demodulates and filters it to generate a substantially smoothed unipolar signal $S_d$ at an output terminal of the circuit 50. The transponder 60 receives the signal $S_d$ and uses it as a supply potential to power active circuits incorporated thereinto.

The transformer 40 provides the advantage of performing a step-up voltage conversion function from its primary region 42 to its secondary region 44 at resonance, thereby providing the signal $S_d$ of sufficient magnitude of several volts to power active electronic devices incorporated into the transponder 60, namely the reflection amplifier 70. Although the transformer 40 cannot provide power gain, it is effective to provide an impedance conversion for matching an input impedance presented by the second circuit 50 to an output impedance presented by the first circuit 30; the signal $S_a$ of relatively lower voltage amplitude from the antenna 20 which is unsuitable for powering circuits is thereby converted into the signal $S_d$ of relatively high voltage, namely several volts, which is suitable for powering circuits.

The transponder 60 receives incoming continuous-wave radiation 102 from the interrogating source. The radiation 102 has a carrier frequency of 1.5 GHz. In response to receiving the radiation 102, the antenna 64 generates a corresponding signal $S_e$ at its terminals which passes to the delay line 68 and propagates therethrough whilst being delayed therein to provide a signal $S_f$ at an input to the reflection amplifier 70. The amplifier 70 presents a modulated negative resistance at its input/output terminal and thereby reflectively amplifies the signal $S_f$ to generate a corresponding modulated amplified signal $S_g$. The signal $S_g$ propagates back through the delay line 68 whilst being delayed therein to the antenna 64 from where it is emitted as return radiation. The interrogating source receives the return radiation and determines that it is modulated, thereby detecting the presence of the tag 10.

The tag 10 provides the benefit that it is capable of providing the modulated return radiation without there being a need for the tag 10 to incorporate limited lifetime power sources such as batteries for powering its active circuits. Avoidance of the need for batteries provides the tag 10 with a potentially useable lifetime of several decades or more. Thus, the tag 10 is thereby suitable for attachment to products which ae to be stored for lengthy periods of time, for example several years.

Sections of the tag 10 will now be described in more detail.

The antenna 20 is a thin film dipole formed by conductive trucks on a major surface of the card. It is designed to operate at a radiation frequency of 1 GHz. The terminal $T_2$ of the antenna 20 is connected to a signal ground on the card, and the terminal $T_1$ is connected to the first circuit 30.

The circuit 30 incorporates two zero-bias Schottky diodes $D_1$, $D_2$ and a filter capacitor $C_1$. The diode $D_2$ is connected by its anode to the diode $D_1$ at its cathode to form an input terminal; the terminal is connected to the terminal $T_1$ of the antenna 20. The diode $D_2$ is connected at its cathode to a first terminal of the capacitor $C_1$. The capacitor $C_1$ incorporates a second terminal which is connected to the signal ground. The diode $D_1$ incorporates an anode which is also connected to the signal ground.

The diodes $D_1$, $D_2$ are operable to provide signal rectification at microwave frequencies, for example 1 GHz, and be responsive to signal amplitudes in the order of in mV. They incorporate metal-semiconductor junctions for performing rectification. Ordinary p-n silicon junction diodes are not as desirable for use in substitution for the diodes $D_1$, $D_2$ because of their relatively greater voltage drop when operating under forward bias. The capacitor $C_1$ is operable to shunt signal components at microwave frequencies to the signal ground. An output from the circuit 30 is extracted from across the capacitor $C_1$, namely from the first terminal of the capacitor $C_1$ relative to the signal ground.

The transformer 40 is fabricated from a had piezoelectric lead zirconate titanate (PZT) material whose dielectric loss coefficient is less than 0.02; the dielectric loss coefficient is defined as a ratio of energy dissipated per cycle to energy stored per cycle. It has exterior dimensions of 3 mm width, 6 mm length and 1 mm thickness and is therefore of an elongate form having an elongate axis. In operation, it is designed to periodically vibrate in a longitudinal manner along the elongate axis at a resonant frequency of approximately 300 kHz. The primary region 42 comprises a multilayer stack of piezoelectric elements, each element having exterior dimensions of 3 mm length, 3 mm width and 0.1 mm thickness and polarised in its thickness direction. The secondary region 44 comprises a single element having exterior dimensions of 3 mm width, 3 mm length and 1 mm thickness; the region 44 is polarised in a direction parallel to the elongate axis when assembled in the transformer 40. The elements of the primary region 42 and the second region 44 are mutually joined by sintering them together or using an epoxy resin of comparable rigidity to the PZT material.

In operation, the transformer 40 exhibits a longitudinal resonance mode at 300 kHz frequency having an associated Q-factor in the order of 100. It functions at its resonance to magnify the voltage amplitude of signals applied to its primary region 42 by generating corresponding signals at its secondary region 44 of relatively greater voltage amplitude. This magnification arises at the expense of reduced signal current at the secondary region 44 compared to the primary region 42; in other words, the transformer 40 provides an impedance match but does not impart power gain.

The circuit 50 employs an identical configuration to the civic 30. The capacitor $C_1$ and the diodes $D_1$, $D_2$ in the circuit 30 correspond to a capacitor $C_2$ and diodes $D_3$, $D_4$ in the circuit 50 respectively.

The reflection amplifier 70 of the transponder 60 is connected at its power supply connections to the signal ground and to the first terminal of the capacitor $C_2$ which is not connected to the signal ground. Electrical power is thereby supplied to the amplifier 70 in operation.

The reflection amplifier 70 incorporates a switching oscillator which periodically switches reflective gain provided by the amplifier 70 between a high gain state and a low gain state. The oscillator is operable to switch the amplifier 70 in a cyclical manner between the high gain state for a period of 2τ and the low gain state for a period of 2τ. In the low gain state, the amplifier 70 is incapable of sustaining spontaneous oscillation within the transponder 60. The period of 2τ corresponds to twice a time duration for signals to propagate in one direction through the delay line 68. Periodic switching of gain provided by the amplifier 70 counteracts the formation of spontaneous oscillation within the transponder 60 because amplified signals from the amplifier 70 are reflected from the antenna 64 and return to the amplifier 70 when it is switched to its lower gain state. In its high gain state, the amplifier 70 provides +23 dB gain which could result in the formation of spontaneous oscillation if the amplifier 70 were not periodically gain switched to the lower gain state as described above.

Figure 2:
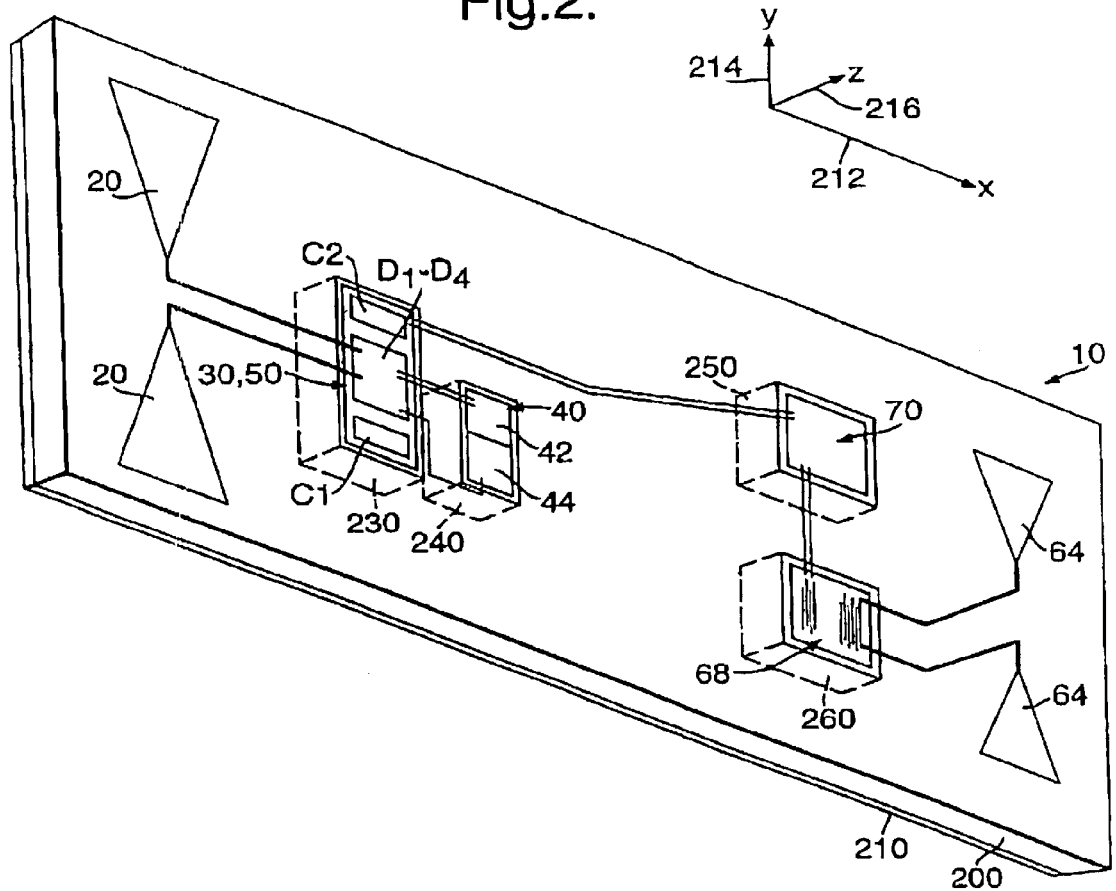
FIG. 2: is an exterior perspective view of the first embodiment shown in FIG. 1.

Referring now to FIG. 2, there is provided an exterior perspective illustration of the tag 10. The tag 10 incorporates a non-conducting plastic substrate layer 200 having first and second major faces. Onto the first major face is bonded a conductive earth-plane layer 210 of aluminium material in a range of 30 μm to 100 μm thick. The layers 200, 210 have a length of 85 mm in an x-direction indicated by an arrow 212, and a width of 55 mm in a y-direction indicated by an arrow 214. The layer 200, 210 have a combined thickness of 1 mm in a z-direction indicated by a arrow 216.

The substrate layer 200 incorporates recesses 230, 240, 250, 260 moulded thereinto to accommodate the circuits 30, 50, the transformer 40, the amplifier 70 and the delay line 68 respectively. Being elongate, the tag 10 has an elongate axis in the x-direction. At first and second elongate ends of the tag 10, the are formed the antennae 20, 64 respectively. The antennae 20, 64 are both bow-tic dipole antennae incorporating deposited metallic regions formed onto the second major face of the layer 200. Connecting conductive tracks are also formed on the second major face to connect the antennae 20, 64 to the circuits 30, 50 and the delays line 68 respectively. Further tracks are included to connect the circuits 30, 50 to the transformer 40 and the amplifier 70, and the delay line 68 to the amplifier 70. Wire bonding techniques are employed for bonding from the tracks to the recesses 230, 240, 250, 260.

When fabricated a 100 μm thick protective plastic layer (not shown) is added onto the second major face to protect the antennae 20, 64, the tacking, the circuits 30, 50, the transformer 40, the amplifier 70 and the delay line 68. Graphical information for example optically readable bar codes or a photographic image, can be optionally printed onto the protective layer. The photographic image is particularly relevant when the tag 10 is personnel wearable and used as a remotely interrogatable identity tag.

Figure 3:
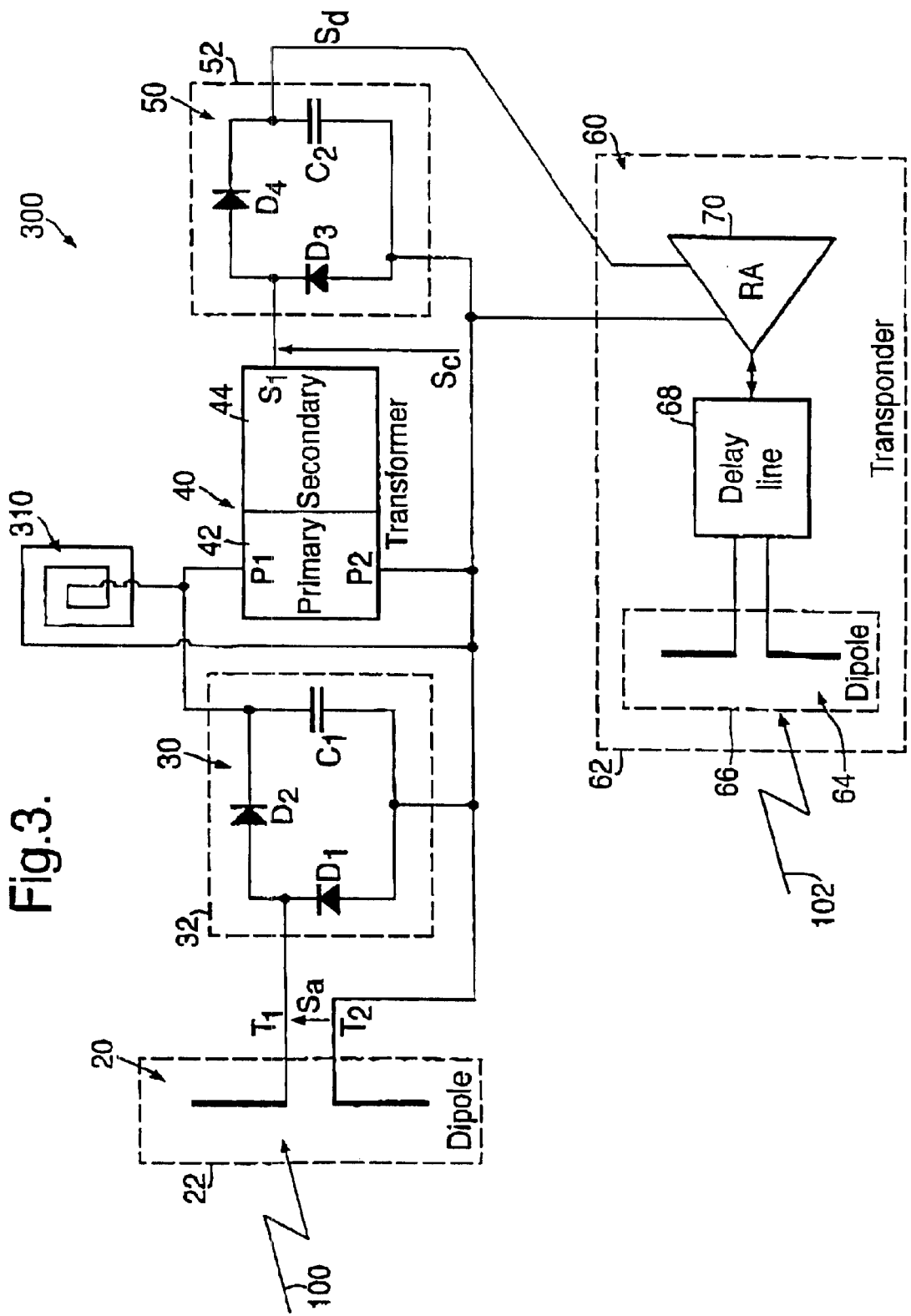
FIG. 3 is an illustration of a second embodiment of the invention.

Referring now to FIG. 3, there is shown a piezoelectric tag according to a second embodiment of the invention indicated by 300. The tag 300 is identical to the tag 10 except that it additionally includes a planar coil 310 in parallel connection with the capacitor $C_1$.

The earth plane layer 210 can be selectively absent in a vicinity of the coil 310 so as not to excessively screen the coil 310. The coil 310 is formed onto the second major face of the layer 200 shown in FIG. 2 adjacent to the circuits 30, 50 and the transformer 40. The capacitor $C_1$, in parallel with an electrical capacitance presented by the transformer 40 between its terminals $P_1$, $P_2$, and the coil 310 are operable to parallel resonate at the resonant frequency of the transformer 40, namely 300 kHz. Inclusion of the coil 310 enables the tag 300 to be powered not only from 1 GHz radiation received at the antenna 20 but also from inductively coupled magnetic fields at 300 kHz coupling to the coil 310. The tag 300 can thereby be powered in two different modes so that it can be used in environments where at either or both frequencies, 300 kHz and 1 GHz, are present; for example, in environments where microwave radiation cannot be tolerated for safety reasons.

As an alternative to using the diodes D1 to D4 in the tags 10, 300, FETs functioning as asynchronous detectors may be employed. FETS operating in this mode exhibit a voltage drop thereacross in the order of microvolts.

Moreover, the antennae 20, 64 may be substituted by a single patch antenna or a single loop antenna operable to receive and emit radiation and convey signals to the circuit 30, and to and from the delay line 68. Although the tags 10, 300 are described as being receptive and emissive at radiation frequencies of 1 GHz and 1.5 GHz, they can be operated at other microwave frequencies by modifying dimension of features of the antennae 20, 64 and the delay line 68. At microwave frequencies in excess of 10 GHz, the delay line 68 is advantageously replaced by a magnetostatic wave delay line (MWDL), for example a delay line incorporating a film of yttrium iron garnet (YIG) providing a signal propagation path in the delay line.

Furthermore, the tags 10, 300 can be modified by replacing the transponder 60 with, for example, a simple oscillator emitting through its antenna encoded radiation unique to the oscillator, thereby enabling the tags 10, 300 when modified to be uniquely identified from the radiation emitted therefrom. Additionally, the transponder 60 can be operable to emit radiation during a first period and be inactive during a second period, the transponder arranged to switch cyclically between the first and second period; this provides the advantage that the transponder 60 can respond by emitting bursts of relatively more powerful radiation during the first period and conserve energy during the second period.

Figure 4:
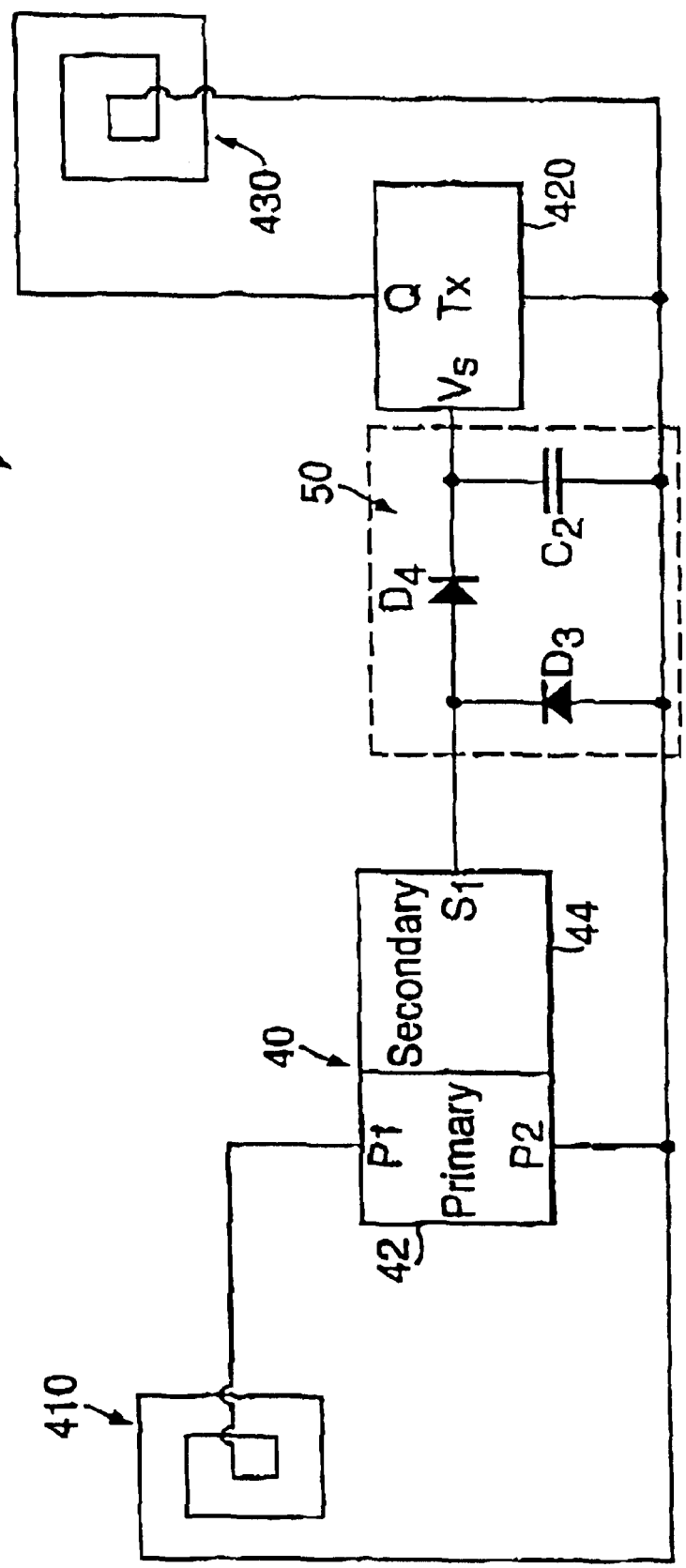
FIG. 4 is an illustration of a third embodiment of the invention incorporating a simplified circuit utilising loop antennae.

Referring now to FIG. 4, is an illustration of a piezoelectric tag indicated by 400 which incorporates a simplified circuit utilising a first loop antenna 410 for receiving radiation, a transmitter module (TX) 420 and a second loop antenna 430 for emitting radiation. The tag 400 further comprises the transformer 40 and the second rectification circuit 50. In a similar manner to the tags 10, 300, the tag 400 is powered from radiation incident thereupon.

The antenna 410 includes first and second connections, the fast connection connected to a signal earth plane of the tag 400 and the second connection connected to the terminal $P_1$ of the transformer 40. The terminal $P_2$ of the transformer 40 is connected to the signal earth plane. The terminal $S_1$ of the transformer 40 is connected to the circuit 50, and the output from the circuit 50 is connected to a $V_S$ power input of a pulsed transmitter 420. The transmitter 420 is also connected to the signal earth plane. Moreover, the transmitter 420 includes an output Q which is connected to a first connection of the antenna 430. A second connection of the antenna 430 is connected to the signal earth plane.

The antenna 410 provides an inductance at its connections which is arranged to electrically resonate with a capacitance exhibited by the transformer 40 across its terminals $P_1$, $P_2$ at a frequency corresponding to input radiation to the tag 400 and also to a vibrational mode of the transformer 40 when functioning to increasing signal voltage from its primary region to its secondary region. The transmitter 420 incorporates a transistor biased into class C mode of operation such that it only conducts for part of a signal cycle when functional when an output from the circuit 50 to the transmitter 420 exceeds a threshold value. When the output from the circuit 50 is less than the threshold value, the transistor is non-conducting, thereby conserving power and providing the circuit 50 with maximum opportunity to develop a potential.

Operation of the tag 400 will now be described with reference to FIG. 4. The antenna 410 receives radiation incident on the lag 400 at a frequency of 300 kHz and provides a 300 kHz signal across the terminals $P_1$, $P_2$ which excites the transformer 40 into resonance. The transformer 40 provides a voltage stepped-up signal at a frequency of 300 kHz at its secondary terminal $S_1$. The signal passes to the circuit 50 which rectifies it to provide a d.c. potential across the capacitor $C_2$. This potential is supplied to the transmitter 420 at its $V_1$ power input. When the potential exceeds a value of 2 volts relative to the signal earth, the transmitter 420 becomes active and generates at its output Q an output signal in the form of busts of signal, each burst comprising a sequence of 500 kHz pulses, each burst having a duration of 50 $\mu$sec and the bursts having a repetition ate of 2 Hz. The output signal couples from the transmitter 420 to the antenna 430 from where it is emitted as radiation.

The tag 400 provides the advantage that it is simpler and potentially cheaper to manufacture than the tags 10, 300. When the tag 400 is manufactured in volume, the transmitter 420 of each tag 400 can be customized to generate bursts of 500 kHz radiation at a repetition rate unique to the tag 420, thereby distinguishing it from other tags of identical design. Class C operation provides the advantage that the transistor does not consume power until radiation above a threshold amplitude is received at the tag 400 which causes the transistor to be driven into an active region of its characteristics.

Modifications can be made to the tag 400 without departing from the scope of the invention. For example, the transformer 40 can be replaced by a piezoelectric vibrating bi-morph or a silicon micromachined vibrating structure capable of providing an increased signal voltage at its secondary region relative to its primary region.

Figure 5:
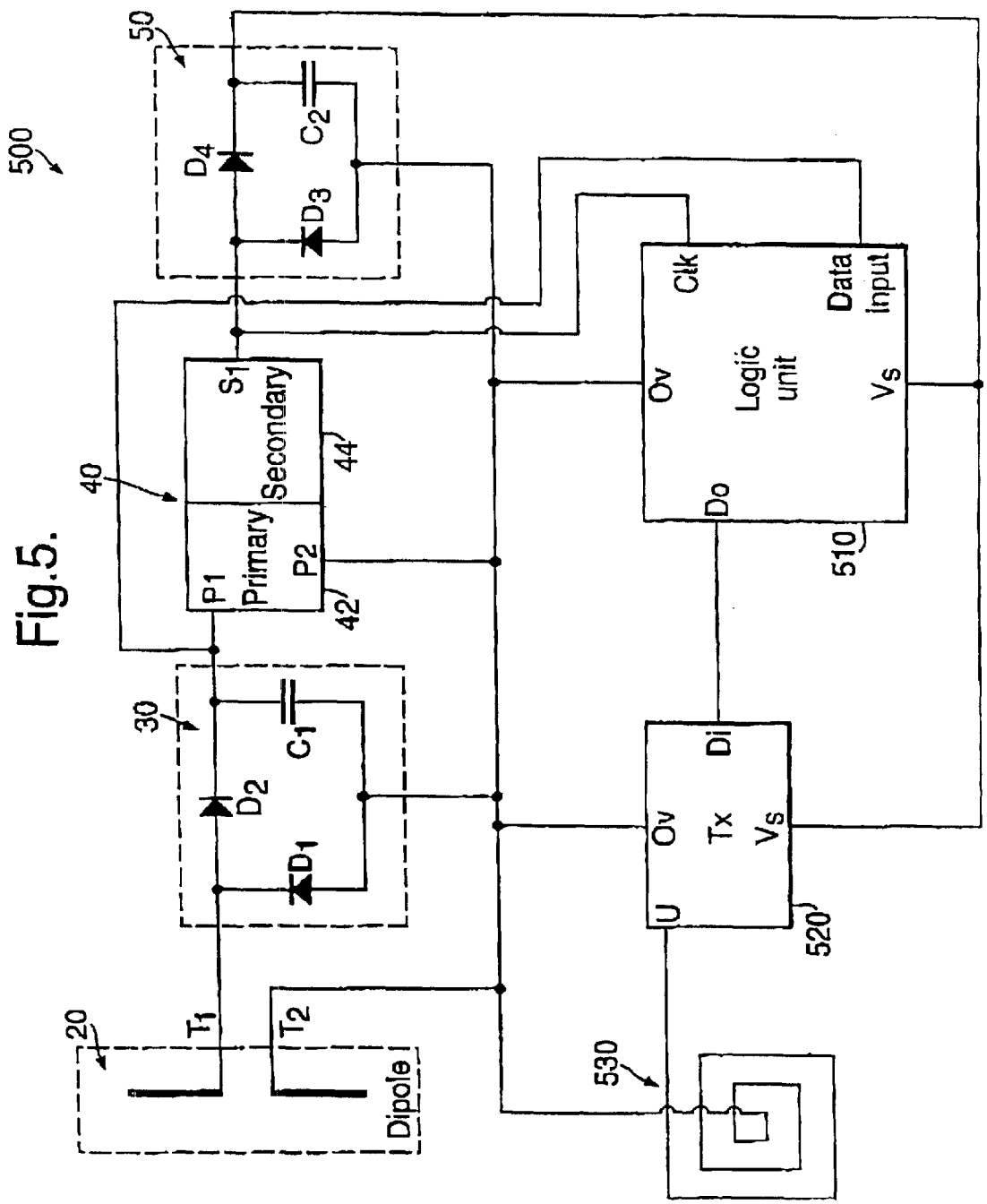
FIG. 5 is an illustration of a fourth embodiment of the invention adapted for operating with Manchester encoded signals.

Referring now to FIG. 5, there is shown a tag indicated by 500 for operating with Manchester bi-phase encoded signals. The tag 500 comprises the antenna 20, the circuits 30, 50, and the transformer 40. It further comprises a logic unit 510 and a transmitter 520 linked to a loop antenna 530. The antenna 20 is connected to the circuit 30 which is in turn connected to the transformer 40 and then to the circuit 50 in an identical manner to the tag 10. An output from the circuit 50 generated across the capacitor $C_2$ is connected to the logic unit 510 and the transmitter 520. Inputs Clk and "Data input" of the unit 510 are connected to the terminals $S_1$ and $P_1$ of the transformer 40 respectively.

The unit 510 incorporates an output $D_o$ which is connected to an input $D_1$ of the transmitter 520. The transmitter 520 includes an output U which is connected to one connection of the antenna 530; another connection of the antenna 530 is connected to a signal earth of the tag 500.

A Manchester bi-phase encoded signal M will now be described. A digital data signal D has two states corresponding to logic 0 and logic 1. The signal D switches between these two states to convey a stream of data comprising 0's and 1's. The signal D remains in either of the two states for periods of not less than $2\tau$ where $\tau$ is a time constant. The signal D is then exclusive-ORed with a clock signal K having a frequency of $1/2\tau$ to generate the signal M. The advantage of the Manchester bi-phase signal is that it is constantly changing even when the signal is in a constant 0 or 1 state.

Operation of the tag 500 will now be daubed decoding the signal M. Radiation having a carrier frequency of 1 GHz and modulated by the signal M is received at the antenna 20 which generates a corresponding 1 GHz modulated signal. The circuit 30 demodulates the 1 GHz signal to generate the signal M at the terminal $P_1$ of the transformer 40. The clock signal K is arranged to have a principal frequency component corresponding to a resonance mode of the transformer 40 at which it provides voltage increase from its primary region 42 to its secondary region 44. Because the transformer 40 exhibits a relatively narrow resonance peak, it is effective at stripping out the signal D from the signal M to output predominantly the signal K at the terminal $S_1$. The signal at the terminal $S_1$ then passes to the circuit 50 which rectifies it to generate a d.c. potential across the capacitor $C_2$. The potential passes to power supply inputs $V_S$ of the unit 510 and the transmitter 520 to apply power thereto. The signal M present at the terminal P1 and the signal K present at the terminal $S_1$ are also conveyed to the inputs Clk and "Data input" respectively of the unit 510 which performs an exclusive-OR function to recover the signal D which is then output at the output $D_o$. The signal D propagates from the unit 510 to the transmitter 520 which is controlled by data conveyed in the signal D. The transmitter 520 responds to the data by emitting modulated 1 MHz radiation from the antenna 530.

The tag 500 provides the advantage that the transformer 40 performs a dual function, namely to generate a supply potential to power the tag 500 and also to provide signal filtration.

Figure 6:
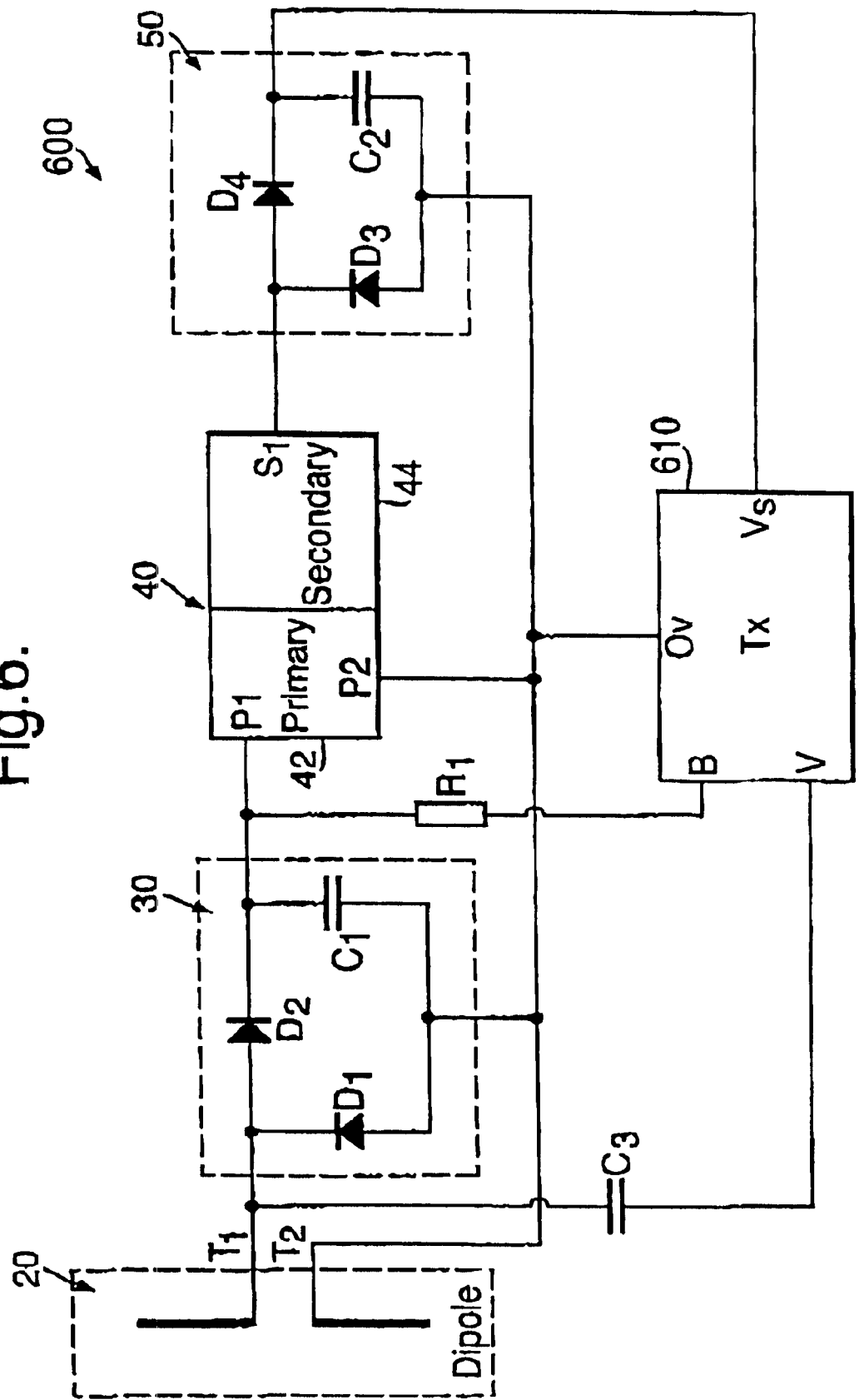
FIG. 6 is an illustration of a fifth embodiment of the invention incorporating a single antenna for use in emitting and receiving radiation.

In order to reduce manufacturing cost and increase compactness, the inventor has appreciated that it is desirable that a tag should only incorporate a single antenna for both receiving and emitting radiation. In FIG. 6, there is shown a tag indicated by 600 incorporating the antenna 20 and operable to both emit radiation therefrom and receive radiation thereat. The tag 600 further comprises the circuits 30, 50, the transformer 40 and a transmitter (TX) 610. The terminals $T_1$, $T_2$ of the antenna 20 are connected to an input to the circuit 30 and to a signal earth respectively. An output from the circuit 30 is connected to the terminal $P_1$ of the transformer 40. The terminal $P_2$ of the transformer 40 is connected to the signal earth. An output B of the transmitter 610 is connected through a resistor $R_1$ to the terminal $P_1$ of the transformer 40. The secondary terminal $S_1$ of the transformer 40 is connected to the circuit 50 in a similar manner to the tag 10. Moreover, the transmitter 610 further comprises an output V which is coupled through a capacitor $C_3$ to the terminal $T_1$ of the antenna 20.

Operation of the tag 600 will now be described with reference to FIG. 6. Initially, the transmitter 610 is not energised such that its output B is at a potential of the signal earth. Radiation having a carrier frequency of 1 GHz and modulated with a signal of 300 kHz is received at the antenna 20 which generates a corresponding signal across its terminals $T_1$, $T_2$. The signal is rectified to generate a 300 kHz signal across the capacitor $C_1$ which then passes to the primary region 42 of the transformer 40 to excite it into resonance. The transformer 40 generates a voltage-enhanced output signal at a frequency of 300 kHz at the terminal $S_1$ which is subsequently demodulated by the circuit 50 to provide a potential for operating the transmitter 610.

The transmitter 610 functions to generate 100 μsec duration bursts of 1 GHz signal at a repetition rate of 2 Hz at its output V. When the transmitter 610 is about to emit a burst of 1 GHz radiation from the antenna 20, it firstly switches its output B to a potential approaching that supplied by the circuit 50 which reverse biases the diodes $D_1$, $D_2$ thereby disabling the circuit 30. The transmitter then outputs a burst signal through the capacitor $C_3$ to the antenna 20 from whence it is radiated as radiation. At the end of the burst signal, the transmitter switches its output B back to a potential of the signal earth so that the circuit 30 can continue to function to keep the capacitor $C_2$ charged until a next burst of radiation is to be emitted.

The tag 600 provides a further advantage that, because only one antenna 20 is required, the antenna 20 can, if required, be enlarged to occupy a majority of a major surface area of the tag 600. Such enlargement is not possible to achieve when two or more antennae are incorporated into a tag, each antenna requiring more than 50% of the major surface area of the tag 600.

It will be appreciated by one skilled in the art that modifications can be made to the tags 10, 300, 400, 500, 600 without departing from the scope of the invention.

For example, the tags 10, 300, 400, 500, 600 can be moulded into a plastic block rather than being implemented in card-like form as illustrated in FIG. 2. The block is a more robust shape compared to a card, thereby enable the tags 10, 300, 400, 500, 600 in block form to be deployed in rugged environments, for marking out a path in a smoke-filled burning building. A block is distinguishable from a card in that the ratio of the block's length, width and thickness dimensions are less than 1:3. A block form also includes a cuboid form, a pyramidal form and a near-spherical or spherical form.

As an alternative to using the diodes D1 to D4 in the tags 10, 300, 400 500, 600, FETs functioning as asynchronous detectors may be employed. FETs operating in this mode exhibit a voltage drop thereacross in the order of microvolts which is less than a forward bias voltage drop associated with diodes.

The tags 10, 300, 400, 500, 600 can be used as personnel wearable identity tags. They may be attached to items of merchandise and used in conjunction with an associated interrogating source to provide a merchandise anti-theft system.

The tags 10, 300, 400, 500, 600 can be used in a similar manner to magic eye reflectors used to delineate lanes on motorways; a plurality of the tags 10, 300, 400, 500, 600 can be employed as interrogatable markers for marking out a path. Such use is potentially valuable, for example, for defining routes for automatically guided robotic vehicles around manufacturing and storage sites. The guided vehicles can be equipped with interrogating sources which are sensitive to direction of radiation emitted from the tags 10, 300, 400, 500, 600 thereby defining direction of the tags 10, 300, 400, 500, 600 relative to the vehicles. Each tag 10, 300, 400, 500, 600 can be provided with its own unique signature code, thereby enabling the vehicle to determine its position along the path from the signature codes. Such a method of vehicle guidance is preferable to wire guided vehicle systems where greater installation cost can arise when installing guiding wires compared to distributing tags.

In the tags 10, 300, 400, 500, 600, the transformer 40 can be replaced by an alternative piezo-electric device operable to increase voltage. One example of an alternative piezo-electric device is a ceramic bi-morph in the form of an elongate member supported at one of its end and free the vibrate at its other end; such a bi-morph is capable of exhibiting a higher Q-factor than the transformer 40, thereby providing an enhanced voltage increase. Another example of an alternative piezo-electric device is a micromachined silicon device comprising an array of one or more suspended silicon cantilevers, each cantilever incorporating a deposited film piezo-electric transducer operable to generate a signal in response to vibration of the cantilever. The transducers are connected in series to add their signal voltages together to provide an overall output for the circuit 50. An excitation transducer operable to be driven by a drive signal from the circuit 30 is also incorporated for mechanically exciting the one or more cantilevers into vibration, preferable at resonance of the cantilevers. Silicon cantilevers are capable of exhibiting high resonance Q-factors approaching several million when operating in a miniature evacuated housing, thereby providing a considerable increase in signal voltage amplitude at the overall output compared to the drive signal. Silicon micromachining is a well known mass production press and involves fabrication of mechanical structures in silicon material using batch lithographic, deposition and etching techniques.

The tags 10, 300, 400, 500, 600 can be modified to include other types of electronic circuits, for example memory circuits and environmental sensors, for example radiation and chemical sensors. Such electronic circuits enable the tags to function as miniature personal data loggers which are personnel wearable and useable for monitoring the safety of personnel in working environments, for example in chemical laboratories where hazardous chemicals are handled.

The tags 10, 300, 400, 500, 600 can be further miniaturised and adapted for inclusion within biological systems, for example for use as remotely controlled insulin dispensers, as heart-stimulating pace-makers or as artificial retina. Use of piezo-transformers powered from received modulated radiation avoids the need for batteries in the tags and thereby enables the tags to be implanted permanently within biological systems without needing to be periodically removed.

What is claimed is:

1. A piezo-electric tag, comprising:
   a) receiving means for receiving input radiation and generating a corresponding received signal;
   b) piezo-electric vibrating means for increasing voltage magnitude of the received signal to generate a supply potential; and
   c) electronic circuit means powerable by the supply potential.

2. The tag according to claim 1, wherein the vibrating means comprises a piezo-electric transformer incorporating mutually vibrationally coupled primary and secondary regions, the transformer being operable to be excited into vibration by the received signal at the primary region and to generate a corresponding output signal at the secondary region for use in generating the supply potential.

3. A tag according to claim 1, wherein the vibrating means comprises a piezo-electric bi-morph operable to be excited into vibration by the received signal and to generate a corresponding output signal for use in generating the supply potential.

4. The tag according to claim 1, wherein the vibrating means comprises a silicon micromachined device comprising an array of resonant elements, each element incorporating an associated piezo-electric transducer operable to generate an element signal in response to vibration of its associated element, the transducers being connected in series to add their element signals to provide an overall output from which the supply potential is generated, and driving means operable to be driven by the received signal for stimulating the elements into vibration and thereby generating the supply potential.

5. The tag according to claim 4, wherein the resonant elements are operable at resonance to generate the supply potential.

6. The tag according to claim 4, wherein the resonant elements are housed in an evacuated environment for increasing their resonance Q factor.

7. The tag according to claim 1 wherein the receiving means incorporates demodulating means for demodulating modulation components present in the received radiation to generate the received signal.

8. The tag according to claim 7, wherein the demodulating means incorporates zero-bias Schottky diodes for demodulating the received radiation to generate the received signal.

9. The tag according to claim 7, wherein the demodulating means incorporates transistors operable as synchronous demodulators for demodulating the received radiation to generate the received signal.

10. The tag according to claim 1, wherein the circuit means is operable to function in a class C mode for reducing tag power consumption.

11. The tag according to claim 1, wherein the receiving means incorporates first and second antennas for generating the received signal for exciting the vibrating means, the first antenna being adapted to respond to microwave radiation, and the second antenna being adapted to respond to radiation having a carrier frequency corresponding to a resonant frequency of the vibrating means.

12. The tag according to claim 1, wherein the receiving means incorporates at least one of a metallic film dipole antenna, a loop antenna and a patch antenna for at least one of receiving and emitting radiation.

13. The tag according to claim 1, wherein the circuit means comprises responding means for emitting output radiation from the tag, the responding means being powerable by the supply potential.

14. The tag according to claim 13, wherein the vibrating means is operable to recover a clock component of Manchester bi-phase encoded radiation received at the tag, and wherein the responding means is operable to use the clock component to demodulate the encoded radiation to generate corresponding demodulated data for use in the tag.

15. The tag according to claim 13, wherein the tag incorporates two antennas, one antenna for use in generating the received signal, and the other antenna incorporated into the responding means for at least one of emitting and receiving radiation.

16. The tag according to claim 13, wherein the antennas are conductive metallic film dipole antennas.

17. The tag according to claim 1, the tag having a form of a block.

18. The tag according to claim 1, the tag having a form of a planar card.

19. The tag according to claim 18, wherein the card incorporates recesses for accommodating the receiving means, the vibrating means and the responding means.

20. The tag according to claim 13, wherein the responding means is a transponder operable to receive input radiation to the tag and emit output radiation in response from the tag.

21. The tag according to claim 20, wherein the transponder is operable to modulate the output radiation with a signature code by which the tag is individually identified.

22. The tag according to claim 20, wherein the transponder incorporates a reflection amplifier for amplifying the input radiation to generate the output radiation.

23. The tag according to claim 20, wherein the transponder is operable in a pseudo-continuous mode and incorporates a delay line for delaying the output radiation relative to the input radiation, thereby counteracting spontaneous oscillation from arising within the transponder from feedback therein.

24. The tag according to claim 1, and a metallic earthing plane for providing a common signal earth for the tag.

25. The tag according to claim 1, and means for implantation into a biological system and operable for at least one of monitoring and stimulating the biological system.

* * * * *

UNITED STATES PATENT AND TRADEMARK OFFICE
CERTIFICATE OF CORRECTION

PATENT NO. : 6,894,616 B1
APPLICATION NO. : 10/048108
DATED : May 17, 2005
INVENTOR(S) : I.J. Forster It is certified that error appears in the above-identified patent and that said Letters Patent is hereby corrected as shown below:

| COLUMN | LINE | ERROR |
|---|---|---|
| (75) Pg. 1, col. 1 | Inventor | "Ian J Forster," should read --Ian J. Forster,-- |
| (30) Pg. 1, col. 1 | Foreign Appl. Priority Data | "9917856" should read --9917856.8-- |
| (56) Pg. 1, col. 2 | Refs. Cited (Foreign Pats.), item 6 | "WO 99/35276" should read --WO 98/35276-- |
| Pg. 1, col. 2 | Assistant Examiner | "D Savoy" should read --D. Savoy-- |
| 1 | 39 | "no" should read --no.-- |
| 2 | 13 | delete "U.S. patent nos." |
| 2 | 21 | "fabricated" should read --fabricated,-- |
| 2 | 21 | "600 z," should read --600 kHz,-- |
| 2 | 63 | "microwave" should read --"microwave-- |
| 2 | 64 | "frequencies" should read --frequencies"-- |
| 3 | 26 | "it capable" should read --it is capable-- |
| 3 | 57 | "antennae" should read --antennas-- |
| 3 | 62 | "antennae," should read --antennas,-- |
| 3 | 65-66 | "anten-nea" should read --anten-nas-- |
| 3 | 66 | "antennae" should read --antenna-- |
| 4 | 1 | "antennae" should read --antennas-- |
| 4 | 2 | "antennae" should read --antennas-- |

UNITED STATES PATENT AND TRADEMARK OFFICE
CERTIFICATE OF CORRECTION

PATENT NO. : 6,894,616 B1
APPLICATION NO. : 10/048108
DATED : May 17, 2005
INVENTOR(S) : I.J. Forster It is certified that error appears in the above-identified patent and that said Letters Patent is hereby corrected as shown below:

| COLUMN | LINE | ERROR |
|---|---|---|
| 4 | 3 | "antennae" should read --antennas-- |
| 4 | 4 | "antennae" should read --antennas-- |
| 4 | 4 | "antennae." should read --antennas.-- |
| 4 | 18 | "incorporate" should read --incorporates-- |
| 4 | 59 | "antennae" should read --antennas-- |
| 4 | 64 | "antennae" should read --antennas-- |
| 5 | 23 | "FIG. 2:" should read --FIG. 2-- |
| 5 | 30 | "antennae;" should read --antennas;-- |
| 6 | 64 | "ae" should read --are-- |
| 7 | 2 | "trucks" should read --tracks-- |
| 7 | 17 | "of in mV." should read --of mV.-- |
| 7 | 27 | "had" should read --hard-- |
| 7 | 58 | "civic" should read --circuit-- |
| 8 | 13 | "lower gain state." should read --low gain state.-- |
| 8 | 27 | "a arrow" should read --an arrow-- |
| 8 | 34 | "the are" should read --there are-- |
| 8 | 35 | "antennae" should read --antennas-- |
| 8 | 35 | "antennae" should read --antennas-- |
| 8 | 35 | "bow-tic" should read --bow-tie-- |
| 8 | 35 | "antennae" should read --antennas-- |

UNITED STATES PATENT AND TRADEMARK OFFICE
CERTIFICATE OF CORRECTION

PATENT NO.        : 6,894,616 B1
APPLICATION NO. : 10/048108
DATED              : May 17, 2005
INVENTOR(S)      : I.J. Forster It is certified that error appears in the above-identified patent and that said Letters Patent is hereby corrected as shown below:

| COLUMN | LINE | ERROR |
|---|---|---|
| 8 | 38 | "antennae" should read --antennas-- |
| 8 | 38 | "delays" should read --delay-- |
| 8 | 44 | "fabricated" should read --fabricated,-- |
| 8 | 46 | "antennae" should read --antennas-- |
| 8 | 46 | "tacking," should read --tracking,-- |
| 9 | 6 | "at either" should read --radiation at either-- |
| 9 | 13 | "antennae" should read --antennas-- |
| 9 | 19 | "modifying dimension" should read --modifying dimensions-- |
| 9 | 21 | "antennae" should read --antennas-- |
| 9 | 39 | "Referring now to FIG. 4, is an illustration of" should read --FIG. 4 illustrates-- |
| 9 | 48 | "fast" should read --first-- |
| 10 | 9 | "lag" should read --tag-- |
| 10 | 15 | "$V_1$" should read --$V_s$-- |
| 10 | 18 | "busts" should read --bursts-- |
| 10 | 20 | "ate" should read --rate-- |
| 11 | 1 | "daubed" should read --described-- |
| 12 | 13 | "antennae" should read --antennas-- |
| 12 | 23 | "enable" should read --enabling-- |

UNITED STATES PATENT AND TRADEMARK OFFICE
CERTIFICATE OF CORRECTION

PATENT NO. : 6,894,616 B1
APPLICATION NO. : 10/048108
DATED : May 17, 2005
INVENTOR(S) : I.J. Forster It is certified that error appears in the above-identified patent and that said Letters Patent is hereby corrected as shown below:

| COLUMN | LINE | ERROR |
|---|---|---|
| 12 | 25 | "environments, for" should read --environments, such as for-- |
| 12 | 32 | "400 500," should read --400, 500,-- |
| 12 | 43 | "magic eye" should read --"magic eye"-- |
| 12 | 63 | "its end" should read --its ends-- |
| 12 | 63 | "free the" should read --free to-- |
| 13 | 9 | "preferable" should read --preferably-- |
| 13 | 16 | "press" should read --process-- |
| 13 | 31 | "retina." Should read --retinas.-- |
| 14 (Claim 7, line 1) | 7 | "claim 1" should read --claim 1,-- |

Signed and Sealed this

Tenth Day of April, 2007

JON W. DUDAS
*Director of the United States Patent and Trademark Office*